US005523755A

United States Patent [19]
Wooten

[11] Patent Number: 5,523,755
[45] Date of Patent: Jun. 4, 1996

[54] N-KEY ROLLOVER KEYBOARD WITHOUT DIODES

[75] Inventor: David R. Wooten, Spring, Tex.

[73] Assignee: Compaq Computer Corp., Houston, Tex.

[21] Appl. No.: 149,971

[22] Filed: Nov. 10, 1993

[51] Int. Cl.⁶ ................................................ H03K 17/94
[52] U.S. Cl. ....................... 341/22; 341/20; 341/24; 341/25; 200/5 A; 364/709.12; 400/479
[58] Field of Search ............................ 341/20, 22, 24, 341/25, 26; 200/5 A; 364/709.12; 400/472, 473, 479, 477, 479.1, 479.2

[56] References Cited

U.S. PATENT DOCUMENTS

| | | | |
|---|---|---|---|
| 3,781,874 | 12/1973 | Jennings | 400/477 |
| 4,459,581 | 7/1984 | Wilson et al. | 341/26 X |
| 4,684,934 | 8/1987 | Small | 341/24 |
| 4,817,010 | 3/1989 | Dobbins | 341/25 |
| 4,878,056 | 10/1989 | Isoda et al. | 341/25 |
| 4,916,275 | 4/1990 | Almond | 200/5 A X |
| 4,918,445 | 4/1990 | Bower | 341/26 |
| 5,189,416 | 2/1993 | Estes | 341/26 |

FOREIGN PATENT DOCUMENTS 0211721  8/1990  Japan .......................................... 341/25

OTHER PUBLICATIONS

Keytronics Corp., Schematic Diagram Of Keyboard For Compaq Computer Corp. Portable 386 Computer.

Keytronics Corp., Schematic Diagram Of Enhanced 101 Keyboard For Compaq Computer Corp. Computers. Jul. 30, 1986.

Advanced Input Devices, Schematic Diagram Of Enhanced Keyboard For Compaq Computer Corp. Portable 386 Computer. Dec. 24, 1987.

Advanced Input Devices, Schematic Diagram Of Enhanced 101 Keyboard For Compaq Computer Corp. Computers. Dec. 24, 1987.

*Primary Examiner*—John K. Peng
*Assistant Examiner*—Daniel J. Wu
*Attorney, Agent, or Firm*—Pravel, Hewitt, Kimball & Krieger

[57] ABSTRACT

A n-key rollover keyboard having an application specific integrated circuit (ASIC) with a large number of pins, each pin directly connected to a key contact, with the other side of the key contact connected to ground. The direct wire arrangement allows use of a single sided circuit board. The keyboard has a reduced cost over prior n-key rollover designs by allowing removal of the series diodes and double sided circuit board.

7 Claims, 3 Drawing Sheets

N-KEY ROLLOVER KEYBOARD WITHOUT DIODES

BACKGROUND OF THE INVENTION

1. Field of the Invention

The invention relates to computer keyboards, particularly keyboards performing n-key rollover, and more particularly to keyboards having n-key rollover without diodes at each key contact.

2. Description of the Related Art

Keyboards are used as the input device for a great many electronic devices. As an example, personal computers have a large keyboard, having 101 keys for example. This large number of keys provides various alphanumeric keys, function and control keys, cursor and editing keys and separate numeric keys. Because of the large number of keys, the keyboards are relatively complicated devices, having a large number of parts. As a result, it is desirable to reduce the cost and parts count of the keyboard.

Because of the large number of keys, it is standard to logically arrange the keys in a matrix and then scan the matrix. A number of lines are output or driven lines and are connected to one direction of the matrix, either rows or columns. A multi-bit data value is provided to these output lines, with one bit being different then the others. This bit is the active bit. The other direction of the matrix is the input, with the keys making connection between the rows and the columns. When a value is being driven on the output lines, the inputs are monitored. Any input having the same level as the active bit is considered closed. After the input lines are read, the active bit in the output value is changed and the inputs read again. This process is repeated continuously as the keyboard scanning function. Thus the state of each key in the keyboard in monitored. When a key is closed or made, as indicated by the particular input at a particular output value being at the active level, the circuitry provides the associated make key code to the computer, resulting in a key input to the computer. When the key is released, as indicated by the particular input at the same output value returning to the inactive level, the circuitry provides an associated break key code.

Typically keyboards come in two main types, two key rollover and n-key rollover. In two key rollover keyboards, the keyboard keeps track of the simultaneous depression of up to two different keys. This is relatively simple to do and so is very cost effective. However, there are many instances in current personal computers where three keys must be simultaneously depressed to perform special functions. Additionally, it is not uncommon for faster typists to be depressing several keys simultaneously in the desired sequence because of the high typing rate and the various mechanical travel distances. Therefore two key rollover keyboards cannot readily be used in personal computers. The problem can be partially alleviated by having certain special keys interpreted specially, but this increases cost of the keyboard.

Therefore n-key rollover keyboards are highly desirable. However, when just simple mechanical closures are used to form the key contacts, such as the various membrane dome mechanisms or other mechanical closure techniques as commonly utilized, a problem called a "phantom key" can result. If three of the four keys forming a rectangle in the key matrix are depressed, the fourth key is perceived to be closed. This occurs because a closed path is available through the three keys to simulate the closure of the fourth key. Obviously this is very undesirable. To resolve this problem it is necessary to install a diode in series with the contacts of each key. The diode prevents the reverse flow of current through the keys, so that the phantom key problem is resolved. Thus n-key rollover keyboards can be developed, but they have diodes at each key contact.

This requirement of the diodes has numerous undesirable side effects. First, the cost of the keyboard is directly increased because of the need to purchase the diodes. Second, assembly of the keyboard is more expensive because of the increased parts count. Third, the matrix organization requires the use of a double sided circuit board, which further increases direct and manufacturing costs.

Therefore it is clearly desirable to develop an n-key rollover keyboard without requiring the use of diodes at each key contact and having a simplified construction.

SUMMARY OF THE INVENTION

The present invention provides an n-key rollover keyboard which does not require the use of diodes at each key contact and can use a single sided circuit board. This combination allows a cost reduction of the keyboard, while providing the desired functions.

The microcontroller or matrix scanner and controller of the conventional keyboard is replaced by a specially developed integrated circuit, referred to as the keyboard application specific integrated circuit (ASIC). The keyboard ASIC is a large pin count device, such as a 132 pin plastic quad flat pack (PQFP). This allows one pin to be provided to each key of the keyboard, three pins to be used to drive light emitting diodes (LEDs) conventionally provided on a keyboard as status indicators, two pins to be used for the serial communications to the computer and a number of power and ground pins. The keyboard ASIC contains all of the necessary serial communications circuitry; the key pullup, buffering and debouncing; the key scanning logic; the command processing and the LED driving circuitry. Thus the keyboard ASIC is the only integrated circuit on the keyboard.

Because a single pin is dedicated for each key, there is no need to arrange the keys in a matrix. One contact of each key is directly wired to its respective pin on the keyboard ASIC. The other contact is connected to ground or the logic level high voltage. By properly arranging the pins of the keyboard ASIC, a single sided circuit board can be used, rather than the conventional and more expensive double sided circuit board. Additionally, as there is no longer a matrix and each key is individually wired, the phantom key problem is resolved and the diodes are no longer needed. This saves additional cost, both upon component purchase and during assembly.

The keyboard ASIC may be slightly more expensive than the microcontroller it replaces, but only by a small amount. Because of the relatively low performance required of the keyboard ASIC, it can be built in a very inexpensive technology, and a PQFP package can readily be used as the technology is also very low power. Thus while the cost of the keyboard ASIC might be more, it will be only slightly more, and the elimination of the diodes and the double sided circuit board more than offset the difference. Thus the cost of the keyboard is actually reduced by directly connecting to each key contact.

BRIEF DESCRIPTION OF THE DRAWINGS

A better understanding of the present invention can be obtained when the following detailed description of the preferred embodiment is considered in conjunction with the following drawings, in which.

DETAILED DESCRIPTION OF PREFERRED EMBODIMENT

Figures 1, 2:
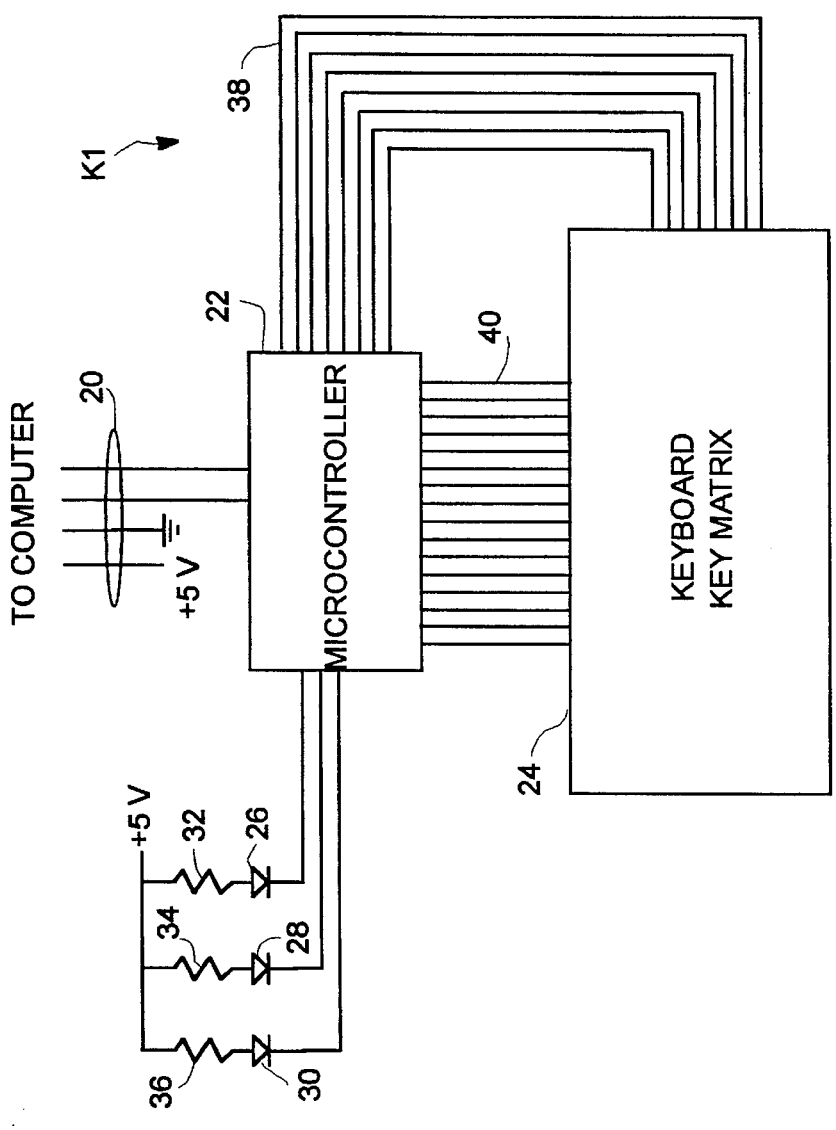
FIG. 1 is a block diagram of a keyboard according to the prior art.
FIG. 2 is a schematic drawing of a portion of a keyboard matrix according to the prior art.

Referring now to FIG. 1, a keyboard K1 according to the prior art is shown. A cable 20 is connected to the computer and provides the signal path to the keyboard K1. The cable 20 includes four wires, one for providing ground, one for +5 volts for power and two conductors for a serial interface as is conventional with keyboard controllers of IBM PC compatible computers. The serial lines of the cable 20 are connected to a microcontroller 22. Typically this microcontroller is a simple 8 bit microcontroller such as the 8051 or the like. The microcontroller includes a series of parallel inputs and outputs which are used to connect to the serial lines in the cable 20, to scan a keyboard key matrix 24 and to drive three LEDs 26, 28 and 30. The LEDs 26, 28 and 30 are connected to the microcontroller 22 and through pull-up resistors 32, 34 and 36 to +5 volts. The microcontroller 22 also includes a small amount of random access memory (RAM) and an amount of read only memory (ROM). The program in the microcontroller 22 is designed to scan the keyboard key matrix 24 by providing a series of outputs on the output lines 38 and then reading the various inputs on the input lines 40. Preferably the input lines 40 are pulled up to a positive level so that a 1 or high value is received if the key is not closed. The keyboard key matrix 24 is comprised of the various keys of the keyboard K1, including alphanumeric, function and control keys, preferably 101 keys in an IBM PC compatible environment, but of course any number of keys such as 80, 84, 96 and so on, that would conventionally be arranged in a matrix, could be utilized as desired.

In operation the microcontroller 22 provides a data value onto the output lines 38. Preferably all of the bits are at the same level or value except one, which is considered at the active bit. The microcontroller 22 then looks at the various inputs 40 to determine if any of the inputs 40 are at active level. Preferably the 0 or low level is the active level as the inputs 40 are preferably pulled up. If so, this is an indication that that particular key, as represented by the combination of the input value and the output value, is closed or depressed.

Conventionally the keyboard key matrix 24 is organized as a series of rows and columns as shown in FIG. 2. It is understood that FIG. 2 shows only a small portion of the keyboard key matrix 24 and is provided merely for exemplary purposes. As many columns and rows as necessary are provided. Thus the outputs 38 drive the rows 60 and 62, while the inputs 40 are connected to the columns 64 and 66. When a given row is driven at a low level as an output and a particular input bit is seen as a low level, this is an indication that the key at the intersection of the matrix is closed. Preferably the individual keys are simple mechanical closures such as by elastomeric dome designs, simple mechanical switch arrangements or other arrangements to provide a positive closure upon key depression. This is shown in FIG. 2 as a simplified open contact 42, 44, 46 and 48. It is specifically noted that a diode 50, 52, 54 or 56 is in series with the key contact 42, 44, 46 and 48 in the portion of the matrix 24 shown in FIG. 2. Typically the cathodes of the diodes 50, 52, 54 and 56 are connected to the outputs 38, while the anodes are connected to the input side. This diode arrangement is required to prevent phantom key development,, as described in the background. If for example diodes were not present and a 0 value was driven on first output line 60 and key contact 42 was closed, this would provide a connection between the first row 60 and the first column 64. If in addition, the second key contact 44 which is connected between the column 64 and the row 62 were closed and the key contact 48 connected to the row 62 and the column 66 were also closed, then a path would exist from row 60 through key contact 42 through column 64 through key contact 44 through row 62 through key contact 48 to column 66. Thus it would appear to indicate that two key contacts 42 and 46 are indeed closed, whereas key contact 46 is actually not closed. This is the phantom key problem. As can be seen, the diode 52 prevents this problem as current can not flow in reverse through the diode 52, so that the phantom key problem is resolved.

However it is noted that the requirement is that a diode be in series with each particular key contact. This presents the problem as noted in the background where the parts cost and manufacturing costs of the keyboard K1 are increased.

Figure 4:
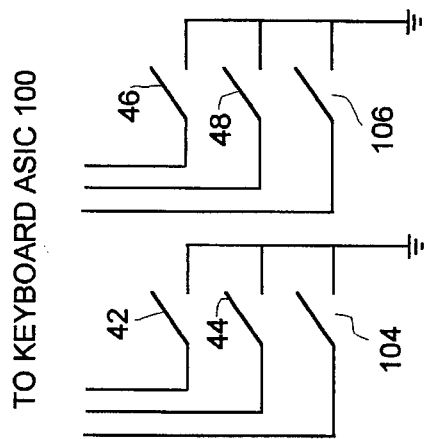
FIG. 4 is a schematic drawing of a portion of the key contacts of the keyboard of FIG. 3.
Figure 3:
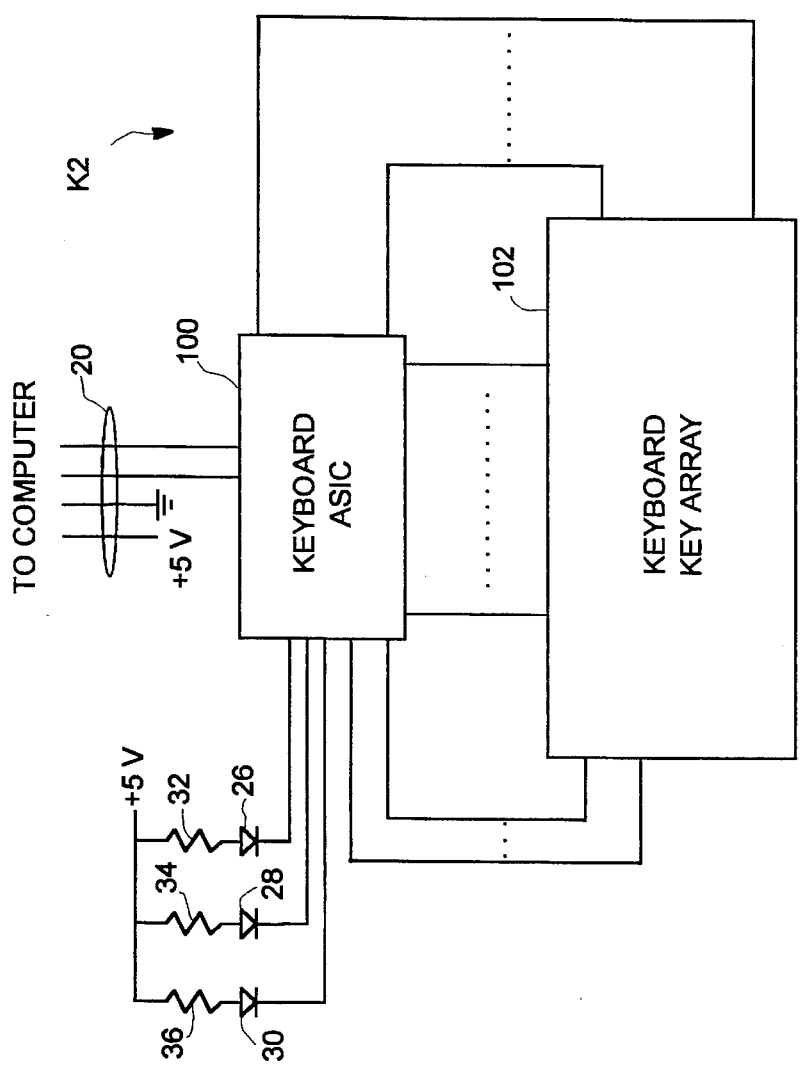
FIG. 3 is a block diagram of a keyboard according to the present invention.

Referring now to FIG. 3, a keyboard K2 according to the present invention is shown. While the preferred embodiment is a keyboard assembly physically separated from the computer housing, as in a desktop personal computer, in another embodiment the keyboard is the integrated keyboard in a notebook or laptop computer. Like parts to the keyboard K1 are numbered with like numbers. The keyboard cable 20 is connected to a keyboard application specific integrated circuit (ASIC) 100. The keyboard ASIC 100 is preferably a large pin count device, such as 132 pins. A number of the pins receive the +5 V and ground connections necessary for conventional operation of an ASIC, while two of the pins are provided for the serial communication lines in the cable 20. Three of the pins are output drivers connected to the LEDs 26, 28 and 30, used to indicate the Caps Lock, Scroll Lock and Num Lock functions on IBM PC compatible keyboards. The remaining pins of the keyboard ASIC 100 are directly connected to each key contact in a keyboard key array 102. The designations of the keyboard key array 102 are similar to those of the keyboard key matrix 24. The direct connection is shown more clearly in FIG. 4. Key contacts 42, 44, 46 and 48 are shown along with additional contacts 104 and 106. As it can be seen, one side of each of the contacts 42, 44, 46, 48, 104 and 106 is connected to ground, while the other side is connected directly to the ASIC 100. Because each of the key contacts 42, 44, 46, 48 and 106 is directly connected between ground and the keyboard ASIC 100, there is no possibility for phantom operation as a matrix is not developed. This allows the removal of the diodes used to prevent the phantom key problem, which in turn reduces costs, both at procurement and manufacturing. Alternatively the key contacts could be connected between the keyboard ASIC 100 and +5 V or some other desired fixed level. In addition, because the keys are not arranged in a matrix fashion, but rather in a much simpler arrangement, if the keyboard ASIC 100 has its pins properly oriented, then it is possible to develop the keyboard K2 on a single sided circuit board, instead of the double sided circuit board required for the keyboard K1. This further reduces costs of the keyboard K2 and simplifies manufacturing as only a single sided circuit board need be manufactured.

Figure 5:
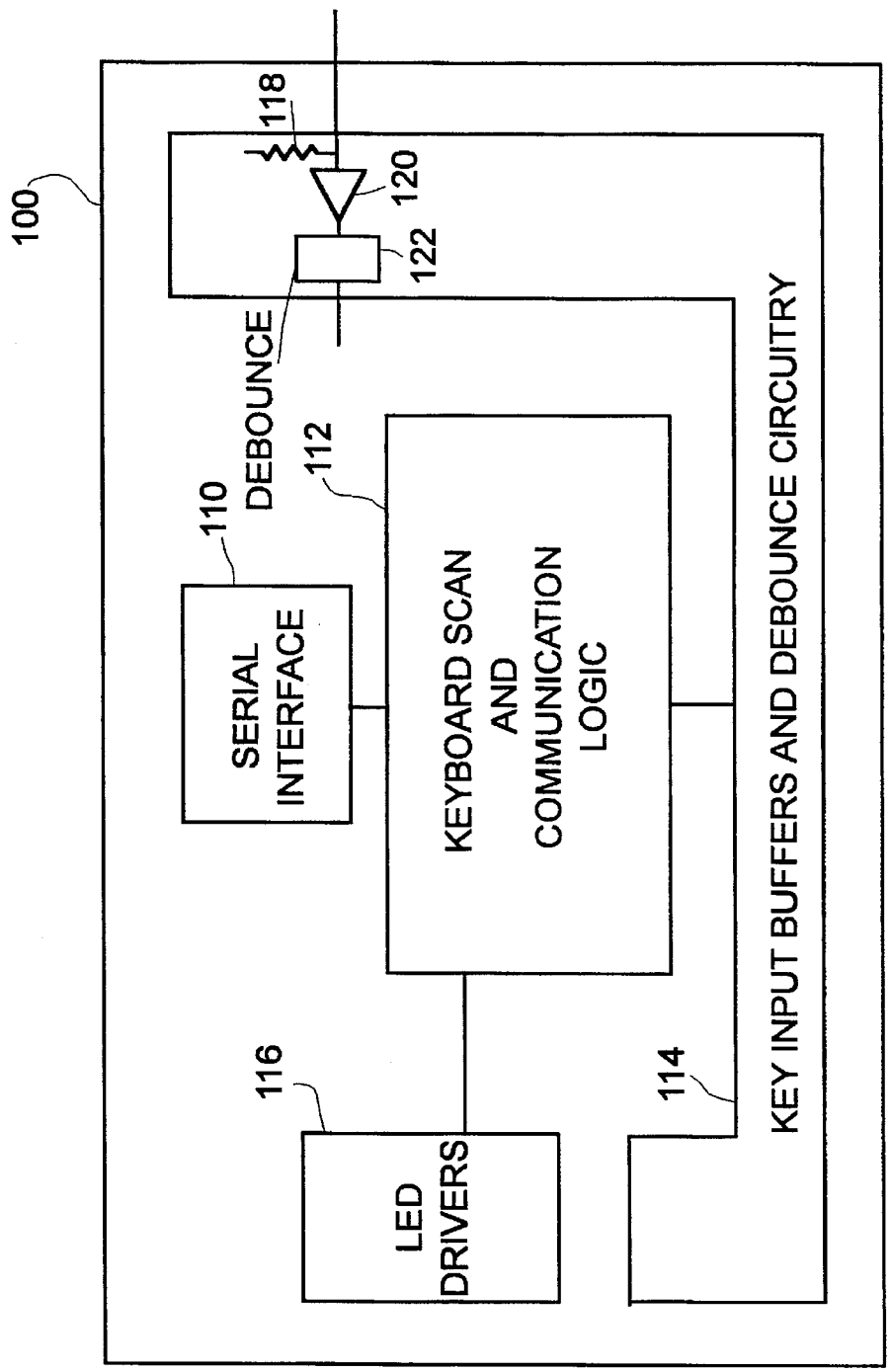
FIG. 5 is a block diagram of the keyboard ASIC of FIG. 3.

Referring now to FIG. 5, a block diagram of the keyboard ASIC 100 is shown. A serial interface block 110 is connected to the serial lines of the cable 20 and provides the required clock and data lines according to the IBM PC compatible keyboard standards. The serial interface 110 is connected to keyboard scan and communication logic 112. The keyboard scan and communication logic 112 is responsible for the general operation of the keyboard K2 and receives commands from the computer to which the keyboard K2 is attached. The keyboard scan and communication logic 112 decodes the commands and performs the requested operation, such as activating the LEDs 26, 28 and 30, resetting, downloading key code sequences if software keys are developed and so on. In addition, the keyboard scan and communications logic 112 also provides the key closure codes, both make and break as conventional in an IBM PC compatible, to the serial interface 110, which then provides the information to the computer. The keyboard scan portion of the logic 112 is connected to key input buffers and debounce circuitry 114. This circuitry 114 is used as the pullup and electrical buffer and includes the necessary debounce circuitry for each of the keys in the keyboard key array 102. This logic is preferably relatively simple as it need just be a simple pullup (or pull down) resistor 118, a simple buffer 120 and simple debouncing circuitry. The keyboard scan portion of the circuitry 122 simply scans through each of the various key inputs in sequence to see if one has changed state. If so, the make or break code is provided to the communication portion in logic 112, which then transmits this to the serial interface 110. The communication logic 112 is also connected to the LED drivers 116 which are the actual driver circuits for the LEDs 26, 28 and 30.

It is understood that this is an exemplary embodiment of the logic arrangement in the keyboard ASIC 100, and other arrangements could be readily developed, with the scan logic replaced by priority encoders, and other changes as readily apparent to those skilled in the art.

As keyboard scan rates are actually relatively low, the keyboard ASIC 100 thus has relatively low performance requirements. As a result, the keyboard ASIC 100 can be made from inexpensive semiconductor technology and can be very low power. These two combinations allow greatly reduced costs. Preferably the packaging of the keyboard ASIC 100 is the most inexpensive available, such as a plastic quad flat pack (PQFP). Because of the high pin count of the package versus the actual simple logic needed, the actual gate count of the ASIC 100 can also be very small. This allows additional functions to be included on the keyboard K2 if so desired.

The keyboard ASIC 100 itself may be slightly more expensive then a microcontroller 22 because of the greater number of pins needed for the actual integrated circuit package, but the simpler circuit technology partially offsets the higher package cost and when the total cost of the keyboard K2 is compared to the keyboard K1, the potential additional cost to the keyboard ASIC 100 is quickly recouped. The decreased component cost, as the individual key contact diodes are not necessary, the use of single sided circuit board instead of a double sided circuit board, and the greatly decreased manufacturing cost by not having to install the diodes and having to only solder on one side of the circuit board instead of two, provide large savings when the entire keyboard cost is considered, to more than cover the added expense of the keyboard ASIC 100. Therefore the overall cost of the keyboard K2 is reduced from the cost of the keyboard K1.

The foregoing disclosure and description of the invention are illustrative and explanatory thereof, and various changes in the size, shape, materials, components, circuit elements, wiring connections and contacts, as well as in the details of the illustrated circuitry and construction and method of operation may be made without departing from the spirit of the invention.

What is claimed is:

1. A keyboard for use with a computer, the keyboard being connected to the computer by a cable to receive power and ground and a serial communications link, the keyboard comprising:

a plurality of keys, including alphanumeric, function and control keys, each key having a mechanical contact, wherein the first side of said mechanical contact of each key is connected to a common voltage level;

an integrated circuit including:

a plurality of pins, said pins including a plurality of power pins for connection to power and ground voltages, a plurality of serial interface pins for connection to the serial communications link in the cable and a plurality of key contact pins equal to the number of said plurality of keys for individual, direct connection to the second side of said mechanical contact of each key; and logic means connected to said plurality of pins for monitoring key closures and providing serial data representative of the key contact closure status to the computer over the serial communications link; and a circuit board receiving said plurality of keys and said integrated circuit and having connections for receiving the cable, said circuit board having circuit traces for connecting said cable to said integrated circuit serial interface pins and said power and ground voltage pins, for connecting said integrated circuit key contact pins to said second side of said key contacts and for connecting said first side of said key contacts to said common voltage level.

2. The keyboard of claim 1, the keyboard further comprising:

a plurality of light emitting diodes located on said circuit board, and wherein said integrated circuit plurality of pins further includes a plurality of pins for connection to each of said light emitting diodes, wherein said integrated circuit logic means activates said light emitting diodes, and wherein said circuit board has traces connecting said light emitting diode to said integrated circuit light emitting diode pins.

3. The keyboard of claim 1, wherein said integrated circuit logic means includes:

means connected to each of said key contact pins for buffering and debouncing the signals received at each of said key contact pins;

serial interface means connected to said plurality of serial interface pins for providing a serial communications link compatible with the computer; and means connected to said means for buffering and debouncing and said serial communications link means for scanning for key contact closure status and developing data to be provided by said serial communications link means representative of the key contact closure status.

4. The keyboard of claim 3, wherein said means for buffering and debouncing includes means for pulling said key contact pins to a voltage level other than the voltage level of said first side of said key contact.

5. The keyboard of claim 3, the keyboard further comprising:

a plurality of light emitting diodes located on said circuit board, and wherein said integrated circuit plurality of pins further includes a plurality of pins for connection to each of said light emitting diodes, wherein said integrated circuit logic means activates said light emitting diodes, and wherein said circuit board has traces connecting said light emitting diodes to said integrated circuit light emitting diode pins.

6. The keyboard of claim 1, wherein said keyboard has 101 keys.

7. The keyboard of claim 1, wherein said circuit board is a single sided circuit board.

\* \* \* \* \*